METHOD OF FABRICATING MASKING SHEETS

Filed June 19, 1961

INVENTOR
REINHARD DAHLBERG

BY [signature]
ATTORNEY

United States Patent Office 3,190,778
Patented June 22, 1965

3,190,778

METHOD OF FABRICATING MASKING SHEETS

Reinhard Dahlberg, Freiburg, Breisgau, Germany, assignor to Clevite Corporation, a corporation of Ohio Filed June 19, 1961, Ser. No. 118,172
Claims priority, application Germany, June 18, 1960, J 18,298
6 Claims. (Cl. 156—62)

Figure 1:
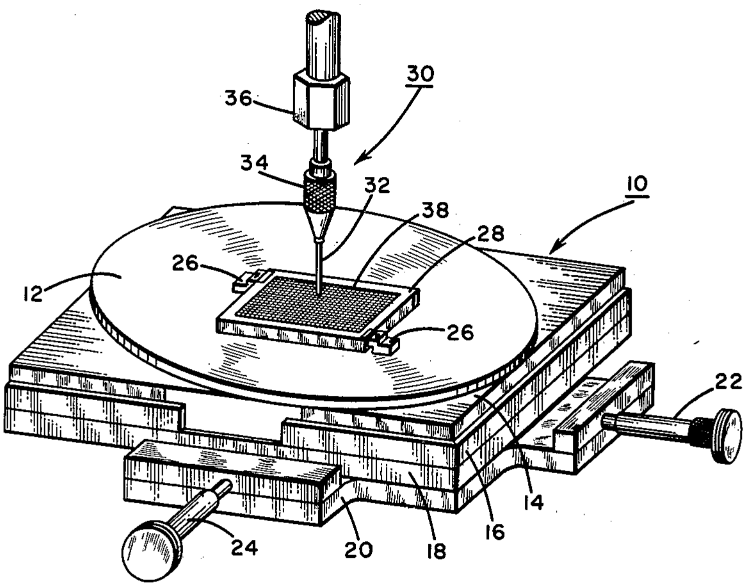

This invention relates to methods for fabricating thin metal sheets containing minute perforations such as the high precision so-called "vaporizing masks" used in the mass production of semiconductor devices having rectifying junctions formed by alloying, diffusion, and like techniques.

While the invention as a whole, or certain aspects thereof, may be susceptible of broader application it is described herein for the sake of example in relation to its field of principle utility, viz., the fabrication of semiconductor devices.

As is well-known in the semiconductor art it is essential in the fabrication of transistors, particularly those suitable for operation at high frequencies, to form the respective contiguous layers of different conductivity types as thin as possible and to control the size, shape and location of rectifying junctions with great accuracy. To this end special fabricating techniques have developed which yield semiconductor devices such as the so-called "mesa" transistor and which utilize alloying, vaporizing and/or diffusion of conductivity-type determinants in the formation of the junctions.

In mass production a large number of devices may be formed on a single large wafer of the semiconductor material which is subsequently subdivided to obtain individual elements. In order to enable control of the size, location and shape of the regions to which the conductivity-type determinants are applied on the wafer, vaporizing masks are widely used.

While simple in concept and structure, the fabrication of suitable masks is fraught with difficulties and continues to be an important problem in the mass production of transistors and other semiconductor devices of this type.

The masks usually take the form of a thin flat sheet having a grid-like structure, i.e., perforated with a large number of small closely-spaced holes. The simplest and perhaps the most obvious method of preparing such a mask consists of simply punching or stamping holes in a sheet of metal foil in the desired arrangement. The manifest simplicity of this approach, however, is wholly superficial and is quickly dispelled by a consideration of the dimensional requirements involved.

For high frequency operation, semiconductor devices must be constructed to extremely small dimension and closely-held tolerances. Consequently, preparing a suitable mask in this manner would require punching holes of 25 by 100 microns in foil about 50 microns thick. The construction of punches and dies for such an operation is hardly possible. To circumvent this difficulty it has been proposed to utilize double foils containing simultaneously punched holes of a relatively larger size, e.g., 300 by 300 microns and off-setting the respective foils so that the apertures are partially out of register and are occluded to the desired size.

Another proposed solution to the problem has been the use of electric discharges to form the tiny perforations. This method is, of course, very costly. Both the mechanical and electrical methods of perforation have the additional disadvantage of subjecting the material to mechanical or thermal effects, introducing stresses which cause the masks to warp or buckle; consequently, the masks do not lie flat in service, resulting in relatively large shaded or partially masked regions detracting significantly from the accuracy of the pattern produced.

Another known approach to the fabrication of vaporizing masks utilizes a photolithographic technique combined with etching. The metal foil which is to form the mask is coated with a photosensitive layer and exposed to photoeffective illumination passing through a transparency bearing the desired pattern in the form of selected opaque and transparent areas. The photosensitive coating is such that, by exposure to the photoeffective illumination, it is rendered resistant to a particular solvent effective on the unexposed coating. The "development" of the foil, therefore, is accomplished by application of the solvent which removes the photosensitive coating from the foil except in the regions exposed to the photoeffective illumination.

After development the foil is etched to form apertures in the regions of the foil devoid of the exposed and developed coating. The difficulty with this technique resides in the preparation of the pattern on the transparency through which the light-sensitized foil is exposed. By enlarging the scale approximately ten times, it is possible to draw conveniently the pattern for the transparency but this entails subsequent photographic reduction of the pattern to the desired size. This is usually done by projecting the drawn image on photographic film. However, due to the distortion in the optical system and limits of the resolving power of the film, it is not possible to obtain sufficiently sharp and accurate facsimiles of the original (drawn) pattern.

These difficulties can be lessened by minimizing the amount of reduction required, but this leads to extraordinary measures for drawing the original pattern to a smaller scale. Thus, for example, with the aid of a precision engraving machine a pattern can be etched on a blackened metal plate to a sufficiently small scale that only a 4:1 optical reduction is required. Even this, however, does not adequately solve the problem because the engraving machine leaves grit particles which, in conjunction with even the lower ratio of optical reduction, causes distortion and blurred etches.

It is the fundamental general object of the present invention to avoid entirely or substantially mitigate the problems and disadvantages of the prior art as summarized above.

A more specific object is to provide novel methods of forming vaporizing masks in which the desired pattern is drawn full scale in the original and therefore does not require optical reduction.

Another object is the provision of improved methods of forming vaporizing masks which do not introduce stresses in the mask.

A corollary of the preceding object is the provision of vaporizing masks which lie flat and in intimate contact with the surfaces to which they are applied.

A further object is the provision of vaporizing masks and the like characterized by a high degree of precision in the location, dimensions, and configuration of the elemental units of its pattern.

These and additional objects of the invention are fulfilled by methods of fabricating vaporizing masks according to the present invention which include providing a flat plate of relatively hard material having on a major surface a coating of relatively softer material; mechanically inscribing on the plate by selective localized removal of the coating a precise pattern of fine intersecting lines defined and characterized by the absence of coating material from the major surface; and employing the inscribed plate as a pattern for making perforations in a thin metallic sheet.

Figure 2:
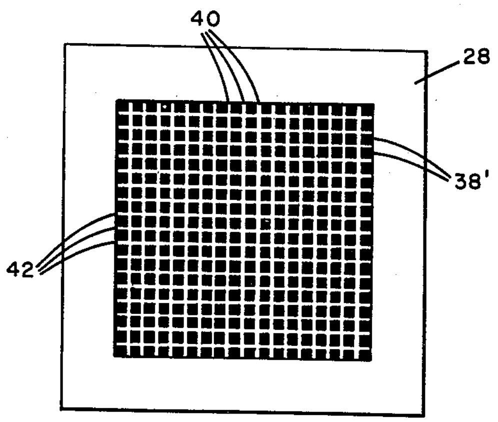

Further objects of the invention, its advantages, scope and the manner in which it may be practiced will be more readily apparent to persons conversant with the art from the following description and subjoined claims taken in conjunction with the annexed drawing in which, FIGURE 1 is a diagrammatic view, in perspective, of an exemplary form of apparatus which may be employed for performance of the method contemplated by the present invention; and FIGURE 2 is a plan view showing, on a greatly enlarged scale, a pattern produced in accordance with the present invention.

Referring first to FIGURE 1, reference numeral 10 designates generally an optical stage of typical and wholly conventional construction. Briefly stated, such an apparatus comprises several flat plates superposed and arranged for independent translatory displacement or rotation relative to one another.

The stage shown in FIGURE 1 comprises five plates designated respectively, from top to bottom, 12, 14, 16, 18 and 20. Plates 14 and 16 are rotatable with respect to each other about vertical axes and, while included because they are among the usual and important components of a typical optical stage, they are not in principal required in the performance of the method contemplated by the invention albeit they may be used, if desired, to increase precision in a manner which will be obvious from the following description.

Plates 18 and 20 are arranged for displacement in parallel planes along respective, mutually perpendicular axes, displacement being effected and controlled with a high degree of accuracy by means of individual micrometer adjustment screws 22 and 24. On the uppermost plate 12 there is fixed by any suitable means such as clamps 26, a plate 28 of relatively hard material, hereinafter described with greater particularity. Plate 28 is disposed and maintained by clamps 26 in a plane parallel to the planes and axes of the adjustment of plates 18 and 20.

Optical stage 10 is disposed, with respect to a vertically mounted scribe assembly 30, so that the working tip of a scribe 32 contacts the upper surface of plate 28. Scribe 32 is held in a suitable chuck 34 slidably mounted in a guide member 36 which constrains the movement of the chuck to linear displacement along a vertical axis and, therefore, perpendicular to the planes of the various plates of optical stage 10.

Chuck 34 is spring pressed, by any suitable means not shown, so that the working tip of scribe 32 is normally urged into contact with the upper surface of plate 28. The working tip of the scribe is flat and co-planar with plate 85. In the event that the axis of scribe 32 is at an acute angle to the plane of plate 28 and optical stage 10, the tip of the scribe would possess a corresponding angle so as to make surface contact, rather than point or edge contact, with the surface on which it bears. The factors governing the size of the scribe tip will become apparent as the present description proceeds.

Prior to installation on optical stage 10, plate 28 has applied to at least one major surface, uppermost when mounted on the stage, a thin surface layer or coating 38 of a material softer than the plate itself. In accordance with particular features of the invention the respective materials of coating 38 and plate 28 are closely interrelated; the material of the plate may be considered as falling in one of two principal categories: (1) hard transparent materials such as glass or (2) opaque metallic substances such as tool steel and similar hard steel alloys.

Additional requirements for the various materials for both plate 28 and coating 38 will be more readily understood and appreciated in view of a description of these steps of the method contemplated by the invention which involves the use of the apparatus shown in FIGURE 1.

With plate 28 mounted, coating side up, as shown and previously described, and the tip of scribe 32 bearing on the coated surface, one or the other of micrometer screws 22, 24 is operated to displace the associated plate 18 or 20 of optical stage 10. As a result of this displacement, scribe 32 traces a line on the plate by local removal of the coating. Having traced such a line across the entire coated surface of plate 28, the other micrometer screw is adjusted to displace the plate a predetermined amount in a direction perpendicular to the line traced thereon by the scribe and, thereafter, the first micrometer screw operated once again to trace a second line precisely parallel to the first.

From the foregoing it will be understood that by alternate and repeitive manipulation of the micrometer screws a precise pattern of fine intersecting lines can be traced on plate 28.

Such a pattern is illustrated on a highly exaggerated scale in FIGURE 2 where it appears as a grid formed by a series of parallel lines 40 formed by removal of coating 38 intersected at right angles by a second series of parallel lines 42. The lines delineate on the surface a pattern composed of uniform segments 38′ of unremoved coating. The size, shape and location of segments 38′ correspond to those of the perforations in the mask being fabricated.

From the foregoing it will be appreciated that the plate 28 must be of a very hard material, whether metallic and opaque or transparent, and coating 38, in addition to being softer, must adhere to the plate so that, in the process of engraving the pattern, the lines scribed are well-defined with sharp edges and the unremoved coating segments do not become detached wholly or partially during subsequent processing.

In accordance with the particular feature of the present invention involving the use of glass or like transparent material for plate 28, satisfactory results have been obtained by forming coating 38 by vapor deposition of an antimony or tin. Vapor deposited tin-bismuth and tin-gold alloys are also suitable.

Prior to application of coating 38 to the glass plate it is advantageous to apply a film (not shown) of tough, translucent paint to the surface which is to be coated. Such a coating enhances the characteristics of the sliding contact between the scribe and the upper surface of plate 28.

With the pattern prepared on glass and defined in the form of effectively transparent and opaque areas, the pattern is conveniently duplicated by a photographic reproduction process, viz., contact printing on photographic film which, in the interests of high resolution, should be of a type having a thin, fine-grained, emulsion. The plate is placed in direct contact with a sheet of the photographic film which is then exposed to photoeffective illumination through the plate. The latent image thus formed is developed and fixed by any suitable chemical treatment.

The developed film pattern is then placed in direct intimate surface contact with a suitable metal foil, e.g., molybdenum, having a photosensitive coating. The photosensitive coating of the metal foil is exposed to illumination passing through the film pattern and the foil subsequently subjected to a "development" treatment which causes the unexposed portions only of the photosensitive coating to be removed leaving a positive reproduction of the pattern on the foil.

At this stage the metal foil is subjected to a nickel plating treatment, conveniently by immersion in an electroless nickel plating bath, and a nickel coating thus deposited on the areas of the foil only which are devoid of the photosensitive coating. The nickel plating procedure is continued until a cohesive nickel foil is formed containing perforations corresponding in size, shape and location to the regions of the metal foil on which the photosensitive paint is retained. The nickel foil thus formed is then loosened and separated from the metal foil and constitutes a vaporizing or alloying mask.

Where the original pattern is engraved on a plate of tool steel or similar metal the procedure is somewhat different. The material utilized for coating 38 may be a softer metal but preferably is a resin. Especially suited to this purpose are resins of unsaturated hydrocarbon such as polyindene or terpene phenol resins. Prior to application of the resin coating, an undercoating of chromium preferably is applied to the surface of the steel plate. The chromium layer facilitates sliding of the scribe over the surface of the plate and has additional advantages which will become apparent as this description proceeds.

The pattern is engraved in the manner already described hereinabove. In this case the pattern is defined by respective region provided with a resinous coating and regions where the resin has been removed.

The plate is then subjected to a nickel plating treatment in the same manner as the glass plate whereby a nickel coating is deposited on the chromium areas from which resin has been removed, with the result that a thin nickel foil is produced, which is a positive replica of the original pattern (i.e., having solid regions corresponding to the lines or grooves of the pattern and perforations corresponding in shape, area and location to segments of unremoved resin on the metal plate). Particularly where the steel plate has been chromium-plated, the nickel foil thus formed can be easily peeled off.

The nickel foil can be used directly as a vaporizing mask at this stage, if desired. However, the foil produced in this manner is usually very thin and easily torn; for this reason it is preferable to use this first foil as a "transparency" to make heavier masks in the manner employed in conjunction with the case where the original pattern is scribed on a glass plate. Specifically, the first thin nickel foil is used to expose a heavier metal foil of molybdenum, for example, having a light-sensitive coating. This is developed and utilized for the fabrication of masks in the same manner as described hereinabove.

Masks prepared according to the present invention are characterized by high precision due to the elimination of errors introduced by optical distortion and blurring of lines. This is reflected in improved uniformity in electrical values of transistors prepared therewith.

While there have been described what at present are believed to be the preferred embodiments of this invention, it will be obvious to those skilled in the art that various changes and modifications may be made therein without departing from the invention, and it is aimed, therefore, to cover in the appended claims all such changes and modifications as fall within the true spirit and scope of the invention.

What is claimed and desired to be secured by United States Letters Patent is:

1. A method of fabricating thin metallic sheets containing minute, closely spaced perforations, which includes; providing a plate of relatively hard, effectively translucent material having on a major surface a thin effectively opaque coating of relatively softer material; engraving said surface so as to selectively remove portions of said coating in a precise predetermined pattern of fine intersecting lines; providing a sheet of metal foil having a photosensitive coating; exposing the photosensitive coating of said metal foil to photoeffective illumination through said pattern to produce an image of said pattern on the photosensitive coating without change of scale; subjecting the exposed metal foil to a development treatment effective to cause removal of unexposed portions only of the photosensitive coating; and thereafter subjecting the thin metal sheet to a metal plating treatment effective to deposit a metal layer on areas of the thin metal sheet free of the photosensitive coating to form a metal foil containing perforations corresponding in size, configuration and location to areas of the photosensitive coating exposed and remaining on said thin metal sheets and removing the metal foil from said thin metal sheet.

2. A method of fabricating thin metallic sheets containing minute, closely-spaced perforations, which includes: providing a plate of relatively hard, effectively translucent material having on a major surface a thin effectively opaque coating of relatively softer material; engraving said surface so as to selectively remove portions of said coating in a precise predetermined pattern of fine intersecting lines; providing a sheet of metal foil having a photosensitive coating; exposing the photosensitive coating of said metal foil to photoeffective illumination through said pattern to produce an image of said pattern on the photosensitive coating without change of scale; subjecting the exposed metal foil to a development treatment effective to cause removal of unexposed portions only of the photosensitive coating; thereafter subjecting the thin metal sheet to a nickel plating treatment effective to deposit a nickel layer on areas of the metal sheet free of the photosensitive coating to form a nickel foil containing perforations corresponding in size, configuration and location to areas of the photosensitive coating exposed and remaining on said thin metal sheet; and removing the nickel foil from said thin metal sheet.

3. A method of fabricating thin metallic sheets containing minute, closely-spaced perforations, which includes: providing a plate of relatively hard, effectively translucent material having on a major surface a thin effectively opaque coating of relatively soften material; engraving said surface so as to selectively remove portions of said coating in a precise predetermined pattern of fine intersecting lines; providing a sheet of photographic film having a thin, fine-grained photosensitive emulsion; placing said film sheet and plate in intimate surface contact and exposing said emulsion to photoeffective illumination passing through said film so as to form a latent image of said pattern on said film; developing the exposed film; providing a thin sheet of metal having a photosensitive coating; placing the developed film in surface contact with the photosensitive coating of said thin metal sheet and exposing said coating to photoeffective illumination through said developed film; subjecting the exposed metal foil to a development treatment effective to cause removal of unexposed portions only of the photosensitive coating; thereafter subjecting the thin metal sheet to a nickel plating treatment effective to deposit a nickel layer on areas of the metal sheet free of the photosensitive coating to form a nickel foil containing perforations corresponding in size, configuration and location to areas of the photosensitive coating exposed and remaining on said thin metal sheet; and removing the nickel foil from said thin metal sheet.

4. A method of fabricating thin metallic sheets containing minute, closely-spaced perforations, which includes: providing a glass plate; vapor depositing on a major surface of said glass plate a thin metal coating selected from the group consisting of antimony, tin, tin-bismuth alloys and tin-gold alloys; engraving said surface so as to selectively remove portions of said coating in a precise pattern of fine intersecting closely-spaced lines; providing a sheet of photographic film having a thin, fine-grained photosensitive emulsion; placing said film and plate in intimate surface contact and exposing said emulsion to photoeffective illumination passing through said film so as to form a latent image of said pattern on said film; developing the image on the exposed film; providing a sheet of molybdenum foil having a photosensitive coating; placing the developed film in surface contact with the photosensitive coating of said molybdenum foil and exposing said coating to photoeffective illumination through said developed film; subjecting the exposed molybdenum foil to a development treatment effective to cause removal of unexposed portions only of the photosensitive coating; thereafter subjecting the molybdenum foil to a nickel plating treatment effective to deposit a cohesive nickel layer on areas of the foil free of the photosensitive coating to form a nickel foil containing perforations corresponding in size, configuration and location to areas of the photosensitive coating exposed and remaining on said molybdenum foil; and separating the nickel foil from the molybdenum foil.

5. A method of fabricating very thin metallic sheets containing minute, closely-spaced perforations, which includes: providing a hard metal plate; applying a resinous coating to a major surface of said plate; mechanically inscribing on said plate, by selective removal of said resinous coating, a precise pattern of fine intersecting lines defined and characterized by the local absence of said resinous coating from said major surface; and subjecting the plate, so inscribed, to a nickel plating treatment effective to deposit a layer of nickel only on areas of said surface free of the resinous coating with concomitant formation of a nickel foil containing apertures corresponding in size, configuration and location to areas of said major surface retaining said resinous coating.

6. A method of fabricating very thin metallic sheets containing minute, closely-spaced perforations, which includes: providing a hard steel plate, chromium-plated; applying to a major surface of said plate a coating of a resin selected from the group consisting of polyindene and terpene phenol resins; mechanically inscribing on said steel plate, by selective removal of said resin coating, a precise pattern of fine intersecting lines defined and characterized by the local absence of said resinous coating from said major surface; and subjecting the plate, so inscribed to a nickel plating treatment effective to deposit a layer of nickel only on areas of said surface free of the resinous coating to form a nickel foil containing apertures corresponding in size, configuration and location to areas of said major surface retaining said resinous coating; and removing the nickel foil from the steel plate.

References Cited by the Examiner

UNITED STATES PATENTS

| | | | |
|---|---|---|---|
| 2,019,590 | 11/35 | Westra | 41—25 |
| 2,333,251 | 11/43 | Huggins | 156—12 |
| 2,346,231 | 4/44 | Ormond | 156—12 XR |
| 2,738,730 | 3/56 | Boyajean | 41—24 XR |
| 2,762,149 | 9/56 | Mears | 96—36 |

EARL M. BERGERT, *Primary Examiner.*